(12) United States Patent
Li

(10) Patent No.: US 7,221,589 B2
(45) Date of Patent: May 22, 2007

(54) MULTIPLE LEVEL PROGRAMMING IN A NON-VOLATILE MEMORY DEVICE

(75) Inventor: Di Li, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/435,705

(22) Filed: May 17, 2006

(65) Prior Publication Data

US 2006/0209596 A1    Sep. 21, 2006

Related U.S. Application Data

(63) Continuation of application No. 11/067,977, filed on Feb. 28, 2005.

(51) Int. Cl.
*G11C 16/04* (2006.01)
(52) U.S. Cl. .............. 365/185.17; 365/185.11
(58) Field of Classification Search .......... 365/185.17, 365/185.11, 185.22
See application file for complete search history.

(56) References Cited

U.S. PATENT DOCUMENTS

| | | | | |
|---|---|---|---|---|
| 6,046,935 A | * | 4/2000 | Takeuchi et al. ...... | 365/185.03 |
| 6,278,632 B1 | * | 8/2001 | Chevallier ............ | 365/185.03 |
| 6,522,580 B2 | * | 2/2003 | Chen et al. ........... | 365/185.02 |
| 6,657,891 B1 | | 12/2003 | Shibata et al. | |
| 6,967,872 B2 | * | 11/2005 | Quader et al. ........ | 365/185.22 |
| 2004/0170056 A1 | | 9/2004 | Shibata et al. | |

OTHER PUBLICATIONS

K. Takeuchi et al.; A Multiple Cell Architecture for High-Speed Programming Multilevel NAND Flash Memories; IEEE Journal Of Solid-State Circuits, vol. 33, No. 8, Aug. 1998; pp. 1228-1238.

* cited by examiner

*Primary Examiner*—Vu A. Le
(74) *Attorney, Agent, or Firm*—Leffert Jay & Polglaze, P.A.

(57) ABSTRACT

The programming method of the present invention minimizes program disturb in a non-volatile memory device by initially programming a lower page of a memory block. The upper page of the memory block is then programmed.

20 Claims, 5 Drawing Sheets

MULTIPLE LEVEL PROGRAMMING IN A NON-VOLATILE MEMORY DEVICE

RELATED APPLICATION

This Application is a Continuation of U.S. application Ser. No. 11/067,977 titled "MULTIPLE LEVEL PROGRAMMING IN A NON-VOLATILE MEMORY DEVICE," filed Feb. 28, 2005, (pending) which is commonly assigned and incorporated herein by reference.

TECHNICAL FIELD OF THE INVENTION

The present invention relates generally to memory devices and in particular the present invention relates to non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

As the performance and complexity of electronic systems increase, the requirement for additional memory in a system also increases. However, in order to continue to reduce the costs of the system, the parts count must be kept to a minimum. This can be accomplished by increasing the memory density of an integrated circuit.

Memory density can be increased by decreasing the distance between the floating gate cells and by decreasing the size of the cells. Additionally, using multi-level cells (MLC) can increase the amount of data stored in an integrated circuit without adding additional cells and/or increasing the size of the die. The MLC method stores two or more data bits in each memory cell.

MLC requires tight control of the threshold voltages in order to use multiple threshold levels per cell. One problem with non-volatile memory cells that are closely spaced, and MLC in particular, is the floating gate-to-floating gate capacitive coupling causes interference between cells. The interference shifts the threshold voltage of neighboring cells as one cell is programmed. This is referred to as a program disturb condition that may program cells that are not desired to be programmed.

One way that has been used to reduce this problem is to perform lower page (i.e., lower threshold voltage) programming of cells neighboring a first cell prior to upper page programming of any cell. Thus, interference is reduced since the threshold voltage of the affected cell is going to be re-adjusted when the upper page programming is performed. This programming method, however, introduces complexity into the programming process.

For the reasons stated above, and for other reasons stated below that will become apparent to those skilled in the art upon reading and understanding the present specification, there is a need in the art for a less complex method for programming multiple level, non-volatile memory cells while reducing program disturb.

DETAILED DESCRIPTION

Figure 1:
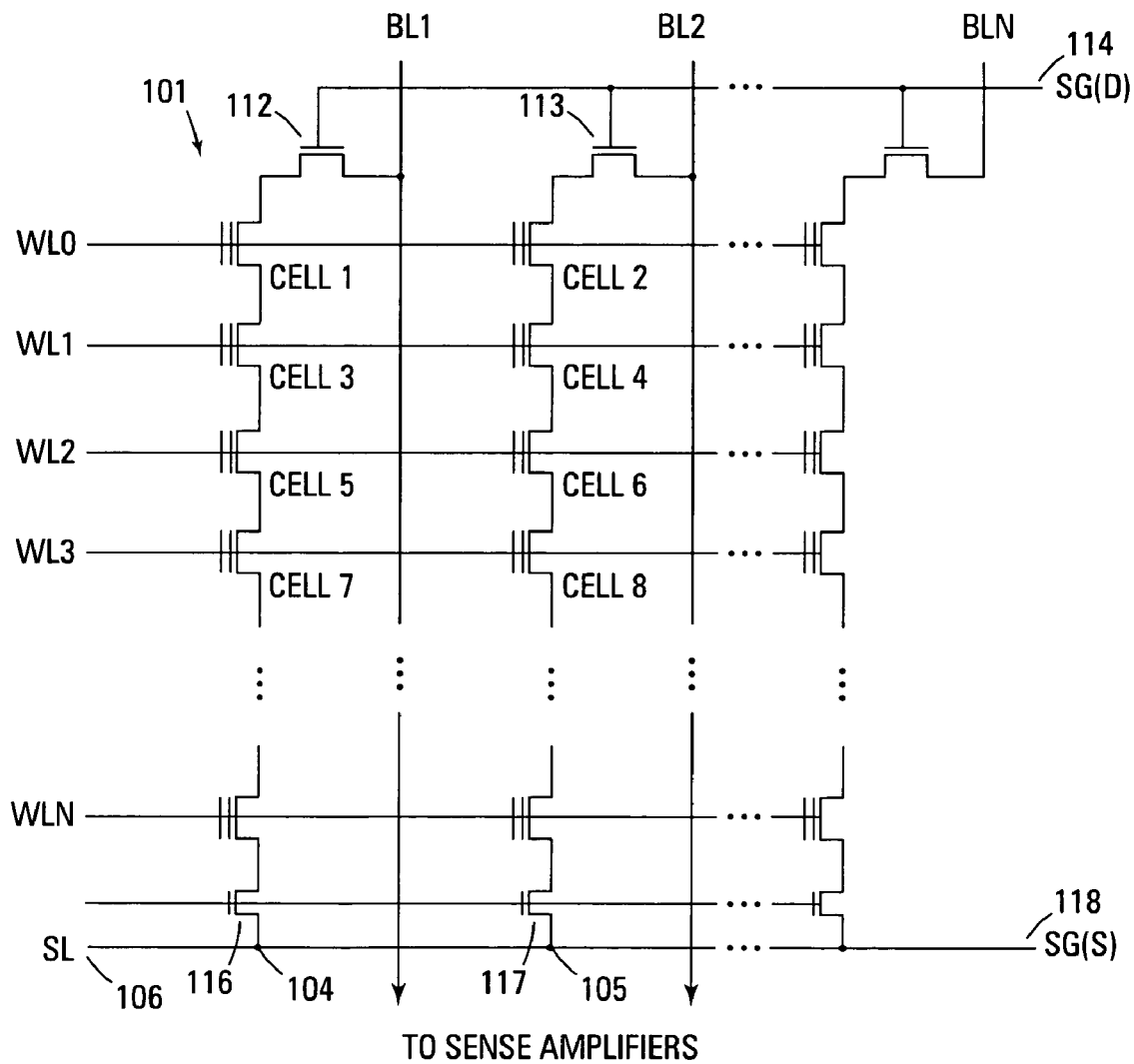
FIG. 1 shows a simplified diagram of one embodiment for a NAND flash memory array of the present invention.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a simplified diagram of one embodiment for a semiconductor NAND flash memory array of the present invention. This memory array is for purposes of illustration only as the present invention is not limited to NAND flash but can be used for other flash architectures (e.g., NOR, AND) and other non-volatile memory technologies such as electrically erasable programmable read only memory (EEPROM).

The memory array of FIG. 1, for purposes of clarity, does not show all of the elements typically required in a memory array. For example, only three bit lines are shown (BL1, BL2, and BLN) when the number of bit lines required actually depends upon the memory density and chip architecture. The bit lines are subsequently referred to as (BL1–BLN). The bit lines (BL1–BLN) are eventually coupled to sense amplifiers (not shown) that detect the state of each cell.

The array is comprised of an array of floating gate cells 101 arranged in series strings 104, 105. Each of the floating gate cells 101 are coupled drain to source in each series chain 104, 105. A word line (WL0–WLN) that spans across multiple series strings 104, 105 is coupled to the control gates of every floating gate cell in a row in order to control their operation. In one embodiment, an array is comprised of 32 word lines. However, the present invention is not limited to any one word line quantity.

In operation, the word lines (WL0–WLN) select the individual floating gate memory cells in the series chain 104, 105 to be written to or read from and operate the remaining floating gate memory cells in each series string 104, 105 in a pass through mode. Each series string 104, 105 of floating gate memory cells is coupled to a source line 106 by a source select gate 116, 117 and to an individual bit line (BL1–BLN) by a drain select gate 112, 113. The source select gates 116, 117 are controlled by a source select gate control line SG(S) 118 coupled to their control gates. The drain select gates 112, 113 are controlled by a drain select gate control line SG(D) 114.

In the embodiment of FIG. 1, the top of the array (i.e., WL0) is at the top of the page and the bottom of the array (i.e., WLN) is at the bottom of the page. However, these labels are for purposes of illustration only as WL0 can also begin at the bottom of the page with the word line numbers increasing towards the top of the page.

Each cell can be programmed as a single bit per cell (i.e., single level cell—SLC) or multiple bits per cell (i.e., multiple level cell—MLC). Each cell's threshold voltage ($V_t$) determines the data that is stored in the cell. For example, in a single bit per cell, a $V_t$ of 0.5V might indicate a programmed cell while a $V_t$ of −0.5V might indicate an erased cell. The multilevel cell may have multiple $V_t$ windows that each indicate a different state. Multilevel cells take advantage of the analog nature of a traditional flash cell by assigning a bit pattern to a specific voltage range stored on the cell. This technology permits the storage of two or more bits per cell, depending on the quantity of voltage ranges assigned to the cell.

For example, a cell may be assigned four different voltage ranges of 200 mV for each range. Typically, a dead space or margin of 0.2V to 0.4V is between each range. If the voltage stored on the cell is within the first range, the cell is storing a 01. If the voltage is within the second range, the cell is storing a 00. This continues for as many ranges that are used for the cell.

The embodiments of the present invention are not limited to two bits per cell. Some embodiments may store more than two bits per cell, depending on the quantity of different voltage ranges that can be differentiated on the cell.

During a typical prior art programming operation, the selected word line for the flash memory cell to be programmed is biased with a programming pulse at a voltage that, in one embodiment, is greater than 16V. A verification operation with a word line voltage of 0V is then performed to determine if the floating gate is at the proper voltage (e.g., 0.5V). The unselected word lines for the remaining cells are typically biased with at approximately 10V during the program operation. In one embodiment, the unselected word line voltages can be any voltage above ground potential. Each of the memory cells is programmed in a substantially similar fashion.

A typical memory block may be comprised of 64 pages of single level cells. An MLC memory block is typically comprised of 128 pages. When one of these pages is accessed, the remaining pages in the block can experience a disturb condition. This occurs for both a read and a write access. In both cases, the pages share common word lines and bitlines that can experience higher programming/read voltages whenever any one of the pages is programmed/read. These voltages can cause problems by disturbing the distributions for the cells that are not being accessed.

Figure 2:
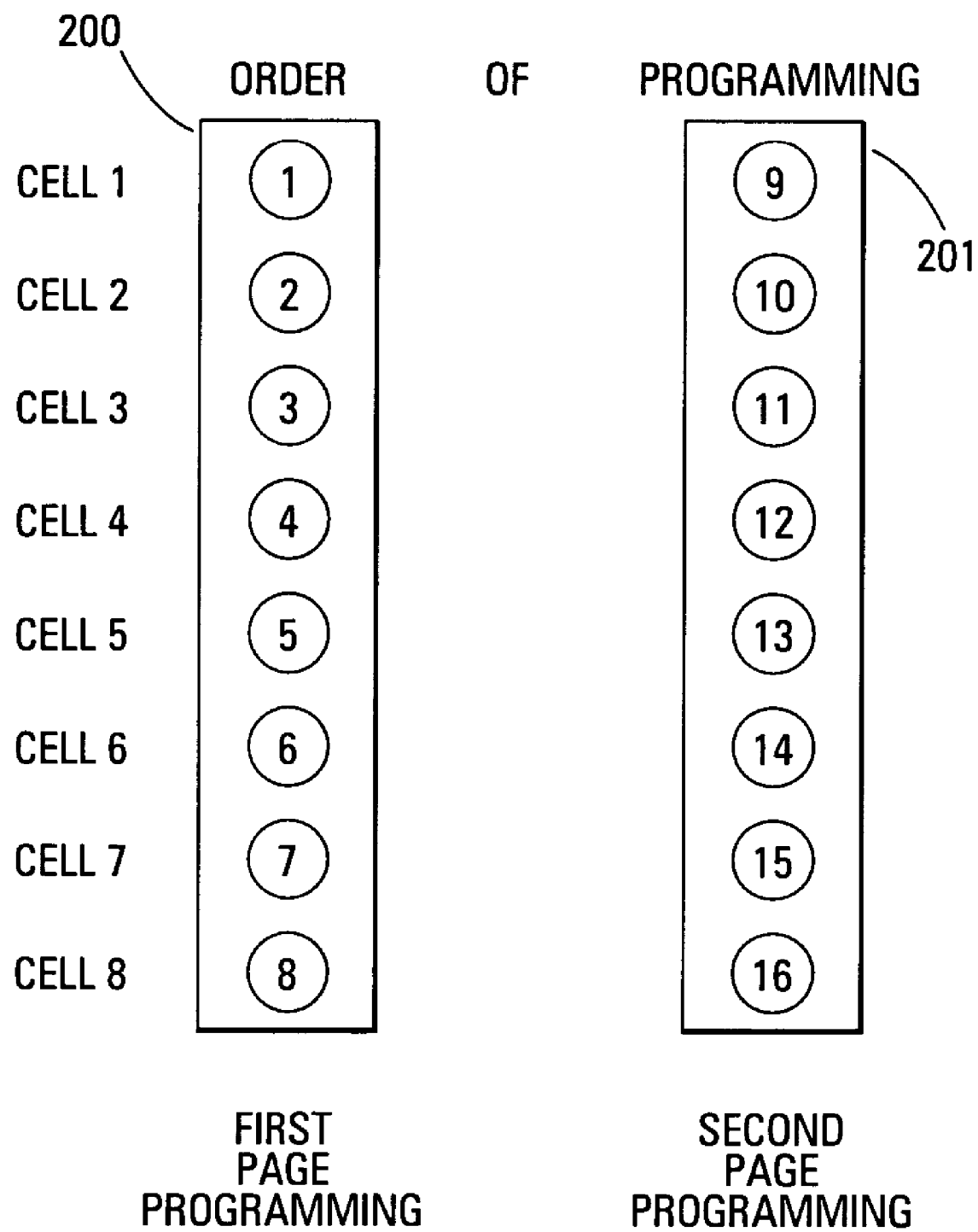
FIG. 2 shows a diagram of one embodiment of a method of the present invention for multiple level programming of a memory device.

FIG. 2 illustrates a diagram of one embodiment of a method of the present invention for multiple level programming of a memory device. This diagram shows the order in which cells and pages of the device are programmed. For purposes of clarity, only eight cells (i.e., four word lines) are discussed. However, this method is repeated to include an entire block of memory word lines. This concept is illustrated and discussed subsequently with reference to FIG. 3.

Each row of the diagram of FIG. 2 illustrates the write operation to each of cells 1–8 that are illustrated in FIG. 1. Each column 200, 201 illustrates the page being programmed (i.e., first or second). Within each page 200, 201 are the circled numbers indicating the order of the write operation.

In a first write operation, one bit of data is written to the first page of memory cell 1. A second write operation writes one bit of data to the first page (i.e., lower page) of memory cell 2. A third write operation writes one bit of data to the first page of memory cell 3. A fourth write operation writes one bit of data to the first page of memory cell 4. A fifth write operation writes one bit of data to the first page of memory cell 5. A sixth write operation writes one bit of data to the first page of memory cell 6. A seventh write operation writes one bit of data to the first page of memory cell 7. An eighth write operation writes one bit of data to the first page of memory cell 8.

Similarly, a ninth write operation writes one bit of data to the second page (i.e., upper page) of memory cell 1. A tenth write operation writes one bit of data to the second page of memory cell 2. An eleventh write operation writes one bit of data to the second page of memory cell 3. A twelfth write operation writes one bit of data to the second page of memory cell 4. A thirteenth write operation writes one bit of data to the second page of memory cell 5. A fourteenth write operation writes one bit of data to the second page of memory cell 6. A fifteenth write operation writes one bit of data to the second page of memory cell 7. A sixteenth write operation writes one bit of data to the second page of memory cell 8.

As is well known in the art, an erase operation is performed on the memory block prior to the above-described write operations. This initializes the memory cells to the logical "11" state. Additionally, a verify operation is performed after the write operations to verify proper programming. The erase and verify operations are well known in the art and not discussed further.

Figure 3:
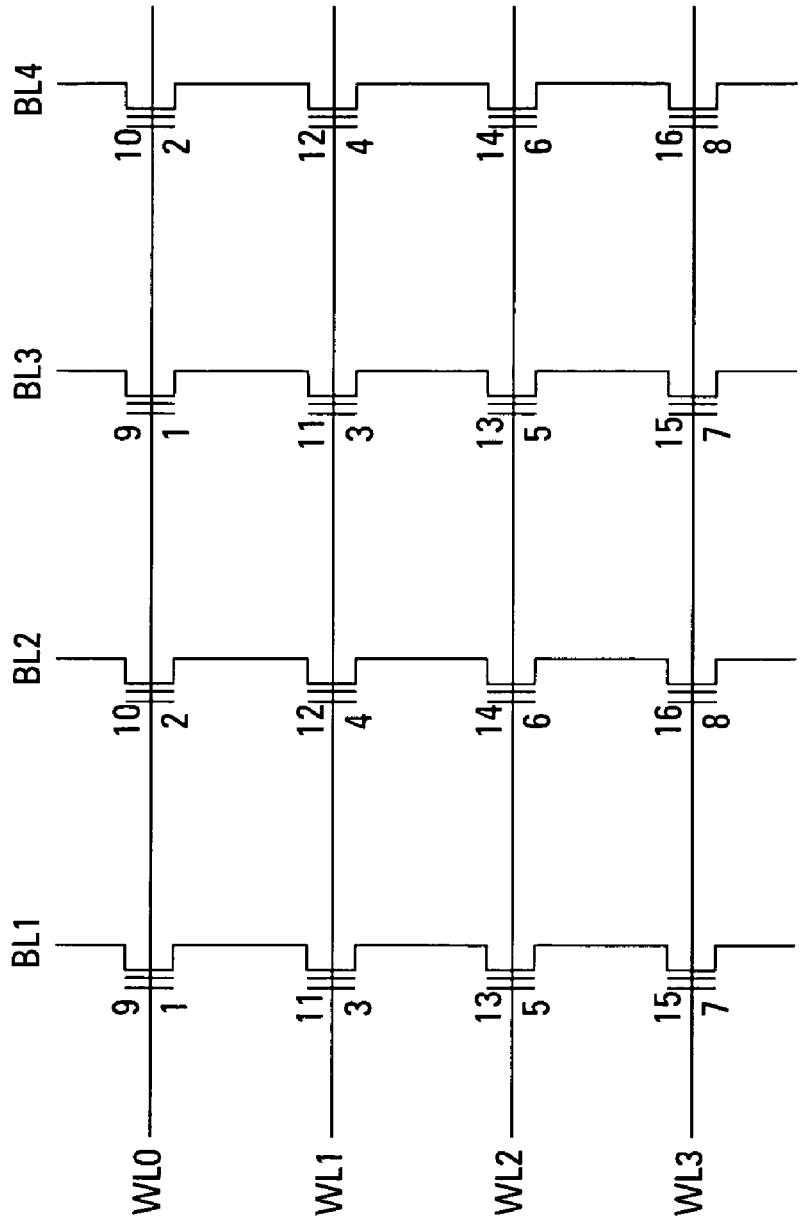
FIG. 3 shows a simplified circuit diagram of a non-volatile memory array in accordance with the multiple level programming method embodiment of FIG. 2.

FIG. 3 illustrates a write pattern to a memory array using the multiple level programming embodiment of FIG. 2. For purposes of clarity, only a small portion of the cells of a memory block are shown.

Each cell shows a pair of numbers near each memory cell gate that indicate the write operation order as discussed previously with reference to FIG. 2. The lower number indicates the order of programming the lower page of the cell. The upper number indicates the order of programming the upper page of the cell. This pattern is repeated throughout the block of 128 pages.

Figure 4:
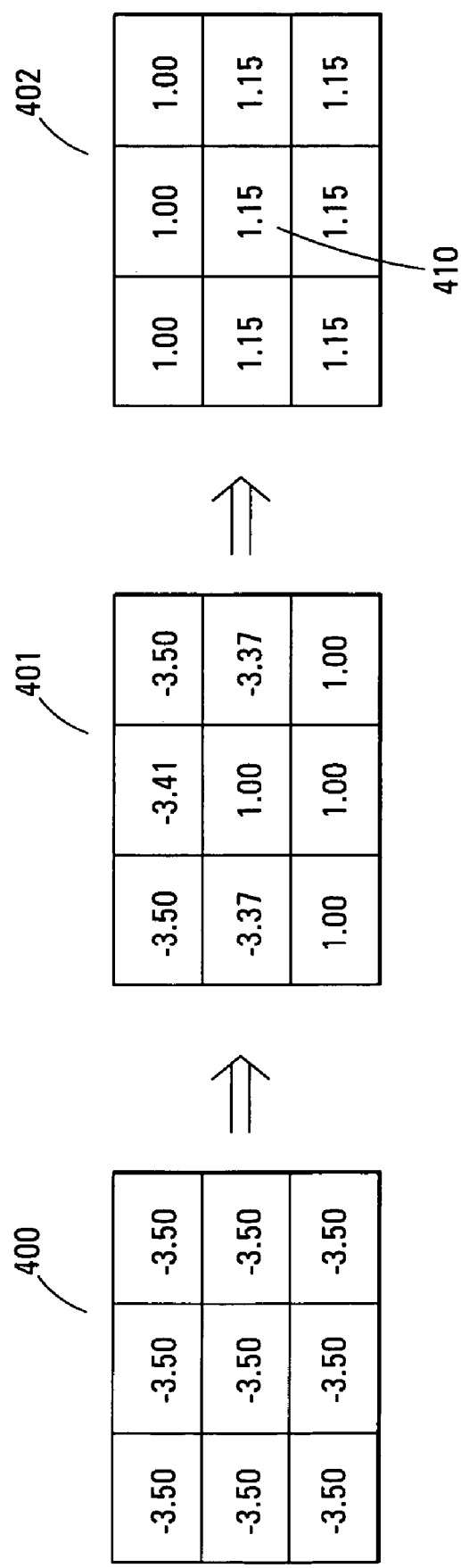
FIG. 4 shows a series of tables of threshold voltages in accordance with the multiple level programming embodiment of FIG. 2.

FIG. 4 illustrates a series of tables of threshold voltages ($V_t$) 400–402 resulting from the programming method of the present invention. The first table 400 illustrates the threshold voltages of a matrix of nine memory cells in an erased (i.e., logical "11") state. In this embodiment, each of the threshold voltages are −3.50V in this state.

The second table 401 illustrates the resulting threshold voltages of the memory cell matrix after the lower page programming operation. The memory cells with the 1.00V threshold voltages have been programmed to a logical "01" state, while the remaining cells are still in the erased state. It can be seen that the cells adjacent to the programmed cells have exhibited a slight change in their threshold voltages.

The third table 402 illustrates the "worst case" resulting threshold voltages of the memory cell matrix after all of the cells of the matrix have been programmed to a logical "01" state. The cells that have a threshold voltage of 1.15V exhibit a slight amount of program capacitance interference since they would be at 1.00V without experiencing interference from neighboring cells. The center cell 410 of the matrix 402 is surrounded by cells that have been programmed and, therefore, should exhibit the most program disturb. However, this cell only experiences a disturb condition of 150 mV. In a typical prior art program operation, such a cell might have a threshold voltage that is 230 mV from the programmed threshold voltage.

Figure 5:
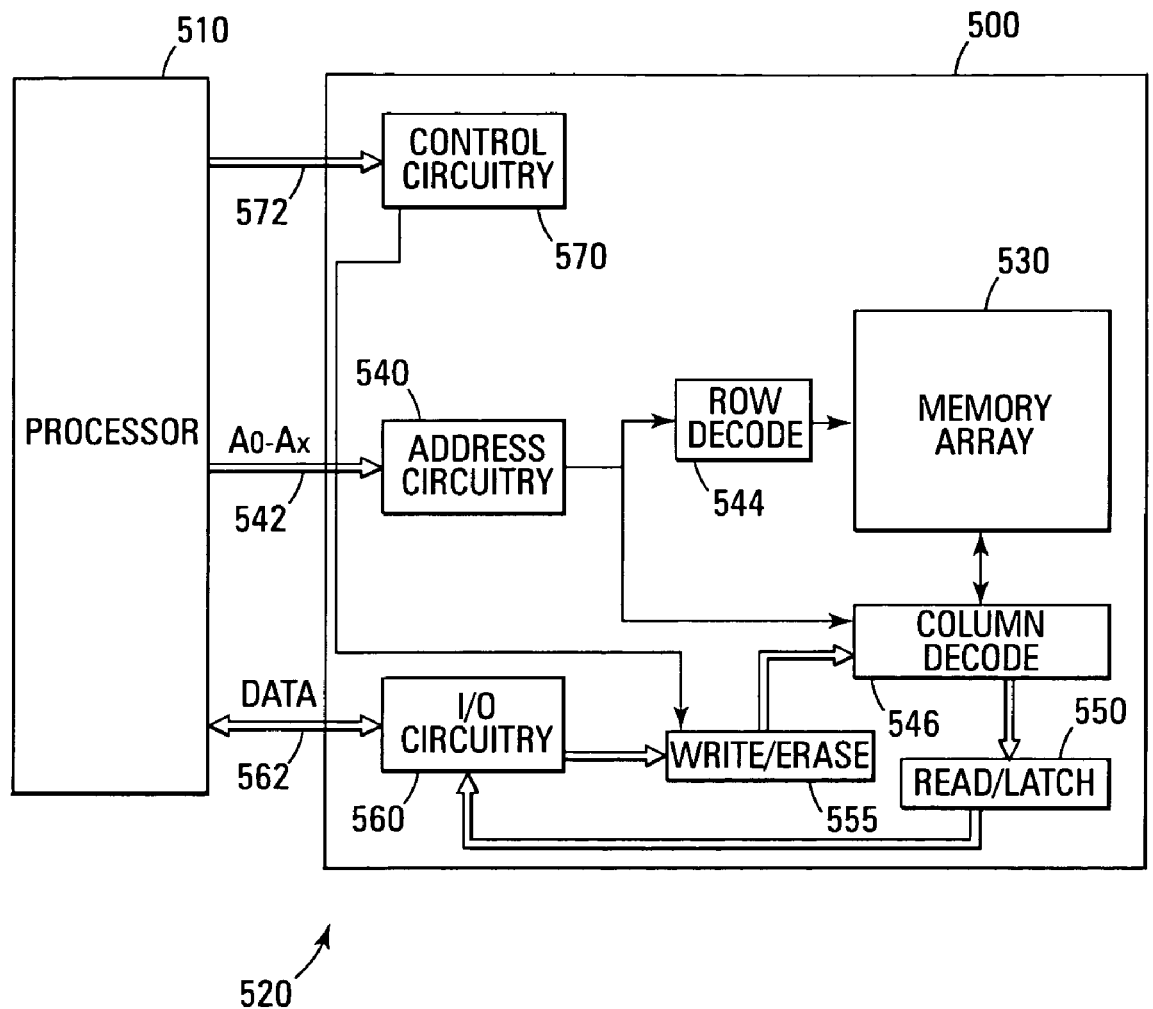
FIG. 5 shows a block diagram of one embodiment of an electronic system of the present invention.

FIG. 5 illustrates a functional block diagram of a memory device 500 that can incorporate the flash memory array and programming method embodiments of the present invention. The memory device 500 is coupled to a processor 510. The processor 510 may be a microprocessor or some other type of controlling circuitry. The memory device 500 and the processor 510 form part of an electronic system 520. The memory device 500 has been simplified to focus on features of the memory that are helpful in understanding the present invention.

The memory device includes an array of flash memory cells 530 as described above with reference to FIG. 1. The memory array 530 is arranged in banks of rows and columns. The control gates of each row of memory cells is coupled with a word line while the drain and source connections of the memory cells are coupled to bitlines. As is well known in the art, the connections of the cells to the bitlines determines whether the array is a NAND architecture, an AND architecture, or a NOR architecture.

An address buffer circuit 540 is provided to latch address signals provided on address input connections A0–Ax 542. Address signals are received and decoded by a row decoder 544 and a column decoder 546 to access the memory array 530. It will be appreciated by those skilled in the art, with the benefit of the present description, that the number of address input connections depends on the density and architecture of the memory array 530. That is, the number of addresses increases with both increased memory cell counts and increased bank and block counts.

The memory device 500 reads data in the memory array 530 by sensing voltage or current changes in the memory array columns using sense/buffer circuitry 550. The sense/buffer circuitry, in one embodiment, is coupled to read and latch a row of data from the memory array 530. Data input and output buffer circuitry 560 is included for bi-directional data communication over a plurality of data connections 562 with the controller 510. Write circuitry 555 is provided to write data to the memory array.

Control circuitry 570 decodes signals provided on control connections 572 from the processor 510. These signals are used to control the operations on the memory array 530, including data read, data write (program), and erase operations. The control circuitry 570 may be a state machine, a sequencer, or some other type of controller. In one embodiment, the control circuitry 570 is responsible for executing the embodiments of the programming method of the present invention for improved interference immunity in a MLC array.

The flash memory device illustrated in FIG. 5 has been simplified to facilitate a basic understanding of the features of the memory. A more detailed understanding of internal circuitry and functions of flash memories are known to those skilled in the art.

CONCLUSION

In summary, the embodiments of the present invention improves margins between MLC levels while maintaining programming throughput. This is accomplished by initially programming all of the lower page bits of a memory block. The upper page bits of the memory block are then programmed. In one embodiment, this programming method can reduce interference by 30–40% in a programmed cell as compared to prior art methods of programming.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for programming a multiple level, non-volatile memory device having a plurality of memory blocks, each memory block organized in rows of word lines and columns of bit lines, the method comprising:

initially programming a lower page of a plurality of memory cells coupled to a first word line such that cells on alternate bit lines along the first word line are programmed substantially simultaneously wherein the alternate bit lines comprise only one of either odd programming operations or even programming operations such that each bit line lower page is programmed only either sequentially odd or sequentially even; and programming an upper page of the plurality of memory cells after the lower page is programmed such that cells on alternate bit lines along the first word line are programmed substantially simultaneously wherein the alternate bit lines comprise only one of either odd programming operations or even programming operations such that each bit line upper page is programmed only either sequentially odd or sequentially even.

2. The method of claim 1 wherein the first word line is part of a memory block comprising 128 pages.

3. The method of claim 1 wherein each of the plurality of memory cells is adapted to store a plurality of bits.

4. The method of claim 1 wherein the memory device is arranged in a NAND architecture.

5. The method of claim 1 wherein the memory device is arranged in a NOR architecture.

6. The method of claim 1 and further including the plurality of memory cells being programmed from an erased state.

7. The method of claim 6 wherein the erased state is a logical "11" state.

8. A method for programming a multiple level flash memory device having a plurality of memory cells organized into a plurality of memory blocks, the method comprising:

programming a lower page of a first memory block of the plurality of memory blocks such that the programming starts at a first word line closest to a source line, the programming comprising substantially simultaneously programming alternate cells in a bit line direction wherein programming the lower page of the first memory block includes performing a first write operation on each alternate memory cell of the first word line in the bit line direction, performing a second write operation on the remaining memory cells of the first word line, performing a third write operation on each alternate memory cell of a second word line in the bit line direction, performing a fourth write operation on the remaining memory cells of the second word line, performing a fifth write operation on each alternate memory cell of a third word line in the bit line direction, performing a sixth write operation on the remaining memory cells of the third word line, performing a seventh write operation on each alternate memory cell of a fourth word line in the bit line direction, performing an eighth write operation on the remaining memory cells of the fourth word line; and programming an upper page of the first memory block, after the lower page is programmed, starting at the first word line, the programming comprising substantially simultaneously programming alternate cells in the bit line direction.

9. The method of claim 8 wherein programming the upper page of the first memory block includes performing a ninth write operation on each alternate memory cell of the first word line in the bit line direction, performing a tenth write operation on the remaining memory cells of the first word line, performing an eleventh write operation on each alternate memory cell of the second word line in the bit line direction, performing a twelfth write operation on the remaining memory cells of the second word line, performing a thirteenth write operation on each alternate memory cell of the third word line in the bit line direction, performing a fourteenth write operation on the remaining memory cells of the third word line, performing a fifteenth write operation on each alternate memory cell of the fourth word line in the bit line direction, and performing a sixteenth write operation on the remaining memory cells of the fourth word line.

10. The method of claim 8 and further including erasing the first memory block prior to programming the first page.

11. The method of claim 8 and further including verifying the first memory block after programming the lower and upper pages.

12. The method of claim 8 wherein each write operation increases a threshold voltage for the programmed memory cell.

13. A flash memory device comprising:
   a memory array comprising a plurality of multiple level memory cells, the plurality of memory cells organized into memory blocks having a plurality of rows of cells coupled to word lines and a plurality of columns of cells coupled to bit lines; and
   control circuitry coupled to the memory array, the control circuit adapted to program the plurality of memory cells by initially programming a lower page of a first memory block prior to programming an upper page of the first memory block wherein cells on alternate bit lines along each word line are programmed substantially simultaneously and wherein the alternate bit lines comprise only one of either odd programming operations or even programming operations such that each bit line lower page is programmed only either sequentially odd or sequentially even and each bit line upper page is programmed only either sequentially odd or sequentially even.

14. The flash memory device of claim 13 wherein control circuitry is further adapted to start programming at a word line closest to a source line of the memory array.

15. The flash memory device of claim 13 wherein the control circuitry is further adapted to perform erase, read, and verify operations on the memory array in response to received commands.

16. The flash memory device of claim 13 and further including sense amplifiers coupled to the memory array for determining a programmed state of the memory blocks.

17. The flash memory device of claim 13 wherein the plurality of multiple level memory cells are organized in one of a NAND architecture, an AND architecture, or a NOR architecture.

18. A memory system comprising:
   a processor for generating memory signals; and
   a NAND flash memory device, coupled to the processor, for operating in response to the memory signals, the memory device comprising:
      a memory array comprising a plurality of word lines that are each coupled to a plurality of multiple level memory cells, the plurality of memory cells organized into memory blocks; and
      a control circuit that is coupled to program the memory array, the control circuit adapted to initially program a lower page of a first memory block prior to programming an upper page of the first memory block wherein cells on alternate bit lines along each word line are programmed substantially simultaneously and wherein the alternate bit lines comprise only one of either odd programming operations or even programming operations such that each bit line lower page is programmed only either sequentially odd or sequentially even and each bit line upper page is programmed only either sequentially odd or sequentially even.

19. The system of claim 18 wherein the memory signals include erase, read, and write signals.

20. A method for programming a multiple level, non-volatile memory block in a non-volatile memory device having a plurality of memory cells organized in rows of word lines and columns of bit lines, the method comprising:
   initially programming a lower page of each memory cell of the memory block such that only sequential odd programming operations are performed on the lower page of a first bit line and only sequential even programming operations are performed on the lower page of a second bit line; and
   programming an upper page of the plurality of memory cells, after the lower page is programmed, such that only sequential odd programming operations are performed on the upper page of the first bit line and only sequential even programming operations are performed on the upper page of the second bit line.

* * * * *

UNITED STATES PATENT AND TRADEMARK OFFICE
CERTIFICATE OF CORRECTION

PATENT NO. : 7,221,589 B2 Page 1 of 1
APPLICATION NO. : 11/435705
DATED : May 22, 2007
INVENTOR(S) : Di Li It is certified that error appears in the above-identified patent and that said Letters Patent is hereby corrected as shown below:

Column 7, line 12, replace "direction, performing" with --direction, and performing--.

Signed and Sealed this

Fourth Day of December, 2007

JON W. DUDAS
*Director of the United States Patent and Trademark Office*